United States Patent [19]
Arita et al.

[11] Patent Number: 4,707,621
[45] Date of Patent: Nov. 17, 1987

[54] MULTIPLEX CONTROL APPARATUS HAVING MIDDLE VALUE SELECTION CIRCUIT

[75] Inventors: Setsuo Arita, Hitachi; Takao Sato, Toukai, both of Japan

[73] Assignee: Hitachi, Ltd., Tokyo, Japan

[21] Appl. No.: 855,455

[22] Filed: Apr. 24, 1986

Related U.S. Application Data

[62] Division of Ser. No. 6,512,000, Jul. 8, 1983, abandoned.

[30] Foreign Application Priority Data

Jul. 13, 1982 [JP] Japan .................................. 57-122561
Jan. 12, 1983 [JP] Japan .................................... 58-2168

[51] Int. Cl.⁴ .................. H03K 19/003; H03K 19/007
[52] U.S. Cl. ................................ 307/441; 307/200 A; 307/442; 307/443; 307/219; 307/357; 307/243; 328/137
[58] Field of Search ........... 307/200 A, 441, 442–443, 307/464, 219, 494, 354, 357, 243, 311; 328/2, 137

[56] References Cited

U.S. PATENT DOCUMENTS

| | | | |
|---|---|---|---|
| 3,555,290 | 1/1971 | Ellermeyer | 307/441 X |
| 3,610,950 | 10/1971 | Keller et al. | 307/441 |
| 3,631,352 | 12/1971 | Kelley et al. | 307/441 X |
| 4,375,683 | 3/1983 | Wensley | 307/464 X |
| 4,507,571 | 3/1985 | Callan | 328/2 X |
| 4,596,048 | 6/1986 | Dunki-Jacobs | 307/311 X |

OTHER PUBLICATIONS

Rostek, "Make Systems Fail-Operational", Electronic Design, vol. 17, Aug. 1969, pp. 213-215.

Primary Examiner—Stanley D. Miller
Assistant Examiner—D. R. Hudspeth
Attorney, Agent, or Firm—Antonelli, Terry & Wands

[57] ABSTRACT

The middle value selection circuit includes three high value selection circuits and one low value selection circuit. Each high value selection circuit consists of a pair of first NPN transistors and a first constant current circuit. The emitter of each first NPN transistor of the high value selection circuit is connected to the first constant current circuit and the base of the second NPN transistor of the low value selection circuit. The base of this second NPN transistor is connected to the second constant current circuit and to an output terminal. The collector of the second NPN transistor is connected to its base. The first constant current circuit produces a current whichis twice the output current of the second constant current circuit. Two analog signals having mutually different combination among three input analog signals are applied to the NPN transistors of one high value selection circuit. The analog signal having a greater value of the two analog signals is generated at the junction of the emitters of these NPN transistors. The analog signals, each representative of the greater value, from the high value selection circuits are applied the emitter of the second NPN transistor. The low value selection circuit produces an analog signal representative of the minimal value among the analog signals applied to the three second NPN transistors.

19 Claims, 17 Drawing Figures

MULTIPLEX CONTROL APPARATUS HAVING MIDDLE VALUE SELECTION CIRCUIT

This is a division of application Ser. No. 06/512,000, filed July 8, 1983, now U.S. Pat. No. 4,593,249, issued June 3, 1986.

BACKGROUND OF THE INVENTION

This invention relates to a middle value selection circuit. More particularly, the present invention relates to a middle value selection circuit which is particularly suitable for use in a multiple redundant control apparatus for various systems for which high reliability is a requisite.

To improve the safety of a nuclear power plant, a triple redundant control apparatus is used for an especially important control system. The middle value of the output signals from the three processing units is selected by one middle value selection circuit and is used as a control signal for controlling an actuator that is disposed in a control valve or the like.

The triple redundant control apparatus of the type described above includes the middle value selection circuit or circuits in order to select the middle value of the input and output signals, as described above. An example of the middle value selection circuit is disclosed in Japanese Patent Laid-Open No. 11638/1975 and Japanese Utility Model Laid-Open No. 117001/1980.

The middle value selection circuit must select a signal which is the most approximate to a true value from the three signals; hence, it is necessary to reduce the error of the output signals as much as possible.

SUMMARY OF THE INVENTION

It is therefore an object of the present invention to provide a middle value selection circuit which is simple in construction and yet can provide high accuracy.

The characterizing feature of the present invention resides in that three first selection means for receiving two analog signals of mutually different combinations among three input analog signals and producing either one of the two signals and second selection means for selecting and producing one of the output signals of each of the first selection means are composed of complementary semiconductor devices.

DESCRIPTION OF THE PREFERRED EMBODIMENTS

The present invention is based upon the clarification of the cause for the occurrence of the error of the output signals in the conventional middle value selection circuits. The results of the investigation will be briefly described as follows.

Figure 1:
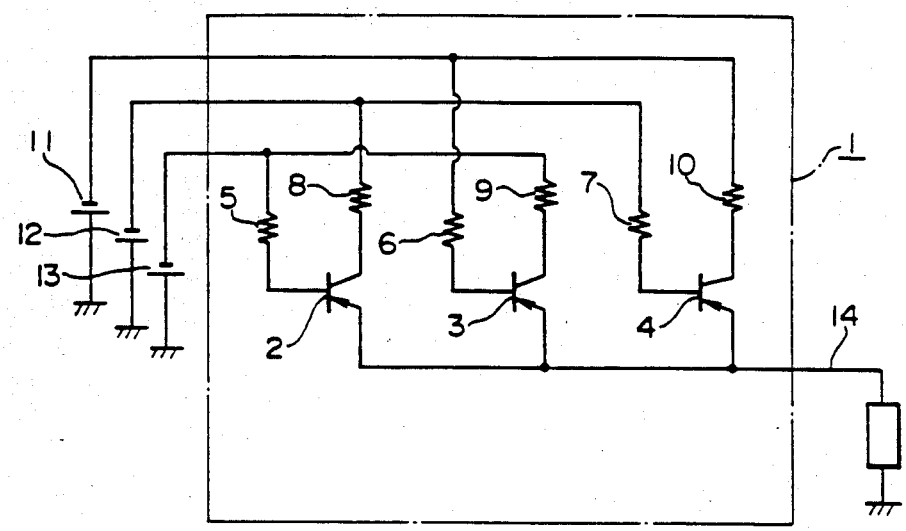
FIG. 1 is a circuit diagram of the conventional middle value selection circuit.

The middle value selection circuit shown in FIG. 1 is disclosed in the aforementioned Japanese Patent Laid-Open No. 11638/1975.

The middle value selection circuit 1 consists of three PNP transistors 2, 3, 4, three current limiting base series resistors 5, 6, 7 and three protective collector series resistors 8, 9, 10. Three input signals 11, 12, 13 are applied to the three junctions between the base series resistors and the collector series resistors of the PNP transistors 6-10, 8-7, 5-9, respectively. A signal corresponding to the middle value of the three input signals is picked out from a connecting line 14 that connects the emitters of these PNP transistors.

It will be assumed that the input signals have the relation of voltage $E_0 < E_1 < E_2$ with $E_0$, $E_1$ and $E_2$ representing the input signals 11, 12 and 13, respectively. Under this state, the PNP transistor 2 is cut off, the PNP transistor 3 is reversely conductive and the PNP transistor 4 is forwardly conductive. Accordingly, a voltage which is higher by the voltage drop across the resistor 7 and the voltage drop across the base and emitter of the PNP transistor 4 than $E_1$ as the middle value signal is generated on the connecting line 14. This middle value selection circuit produces the signal of the middle value of the three output signals while containing the error. The error contained in the output signal of the middle value selection circuit arises from the construction of the middle value selection circuit itself.

The inventors of the present invention have examined various methods of reducing the error of the output signal of the middle value selection circuit and have found out that the error of the output signal of the middle selection circuit can be reduced by constructing high and low value selection circuits forming the middle value selection circuit in such a manner that the polarity of the error of each selection circuit output signal becomes inverse. In other words, the inventors have reached the conclusion that the error can be reduced by constructing the high and low value selection circuits by complementary semiconductor devices. The embodiments of the present invention based upon this finding will be hereinafter explained.

Figure 2:
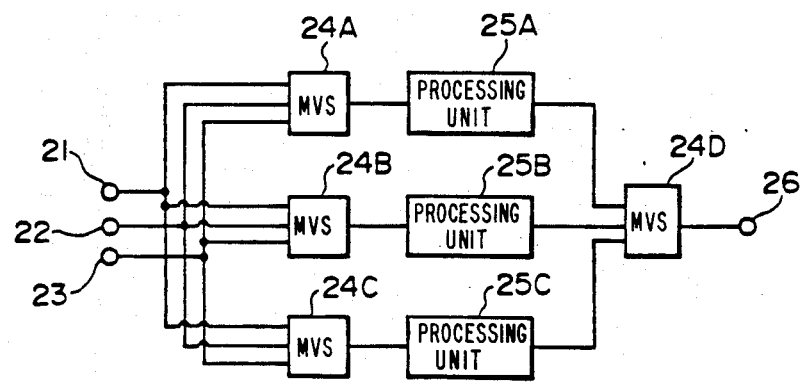
FIG. 2 is a block diagram of the triple redundant control system.

One preferred embodiment of the present invention will be described with reference to FIGS. 2 and 3. FIG. 2 shows a triple redundant control apparatus. In a nuclear power plant, three sensors 21, 22 and 23 are disposed so as to detect the quantity of the same state in an important control system and equipments to be controlled are controlled on the basis of the detection signals (analog signals) of these sensors. The sensor output signals are applied to three middle value selection circuits 24A, 24B and 24C that are juxtaposed with one another. The middle value selection circuits 24A, 24B, 24C select the middle value of the output signals of the respective sensors. The output signal selected by each middle value selection circuit is applied to a corresponding processing unit (controller) 25A, 25B, 25C. Each controller effects calculation, comparison and judgement on the basis of the input signal and produces an output signal for controlling the equipment to be controlled. The control signal generated from each controller is applied to one middle value selection circuit 24D. This middle value selection circuit 24D selects the middle value of each control signal and produces an output signal to an actuator of the equipment to be controlled. The actuator 26 controls the equipment to be controlled on the basis of the control signal of the middle value. The triple redundant control apparatus can control the equipment with the output signal, which is the most approximate to the true value, even if the output signal changes as one of the sensors 21, 22, 23 or one of the middle value selection circuits 24A, 24B, 24C or one of the controllers 25A, 25B, 25C becomes out of order.

Figure 3:
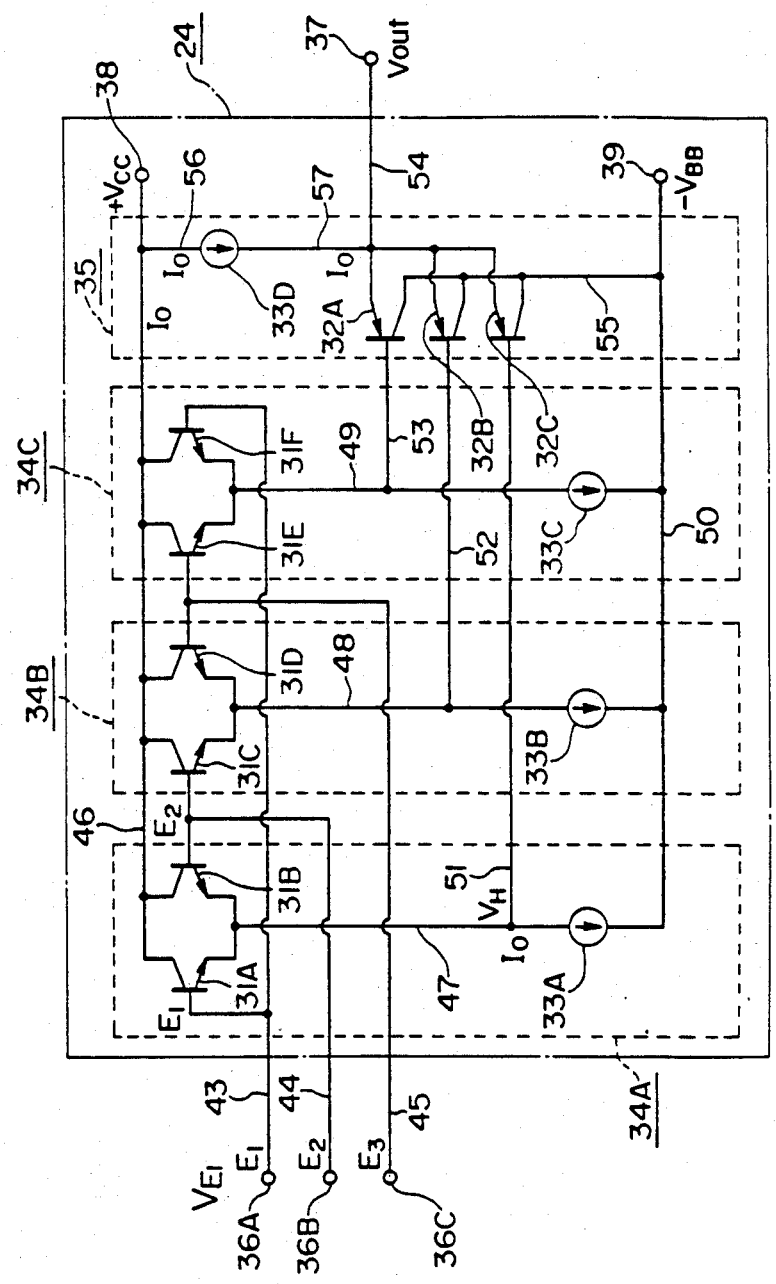
FIG. 3 is a circuit diagram of the middle value selection circuit in accordance with one preferred embodiment of the present invention.

FIG. 3 shows the definite construction of the middle value selection circuits 24A–24D. The middle value selection circuit 24 includes NPN transistor 31A–31F, PNP transistors 32A, 32B and 32C, and constant current circuits 33A, 33B, 33C and 33D. The middle value selection circuit 24 consists of the high value selection circuits 34A, 34B and 34C and the low value selection circuit 35. The high value selection circuits 34A–34B are disposed at the prior stage with the low value selection circuit 35 at the posterior stage.

The high value selection circuit 34A consists of a pair of NPN transistors 31A, 31B and a constant current circuit 33A. The high value selection circuit 34B consists of NPN transistors 31C, 31D and a constant current circuit 33B. The high value selection circuit 34C consists of NPN transistors 31E, 31F and a constant current circuit 33C. The low value selection circuit 35 consists of PNP transistors 32A, 32B, 32C and a constant current circuit 33D. The NPN transistor of the high value selection circuit is complementary to the PNP transistor of the low value selection circuit. The NPN and PNP transistors of the high and low value selection circuits in the later-appearing embodiments are also complementary to one another.

Reference numerals 36A, 36B, 36C represent the input terminals of the middle value selection circuit 24. The input terminal 36A is connected to the base of the NPN transistor 31A and to the base of the NPN transistor 31F by a line 43. The input terminal 36B is connected to the base of the NPN transistor 31B and to the base of the NPN transistor 31C by a line 44. The input terminal 36C is connected to the base of the NPN transistor 31D and to the base of the NPN transistor 31E. The collectors of the NPN transistors 31A through 31F are connected to a line 46. This line 46 is connected to the terminal 38. The emitters of the NPN transistors 31A, 31B are connected to the constant current circuit 33A by a line 47. A line 48 connects the emitters of the NPN transistors 31C, 31D to the constant current circuit 33B. A line 49, which is connected to the constant current circuit 33C, is connected to the emitters of the NPN transistors 31E, 31F. The constant current circuits 33A through 33C are connected to a terminal 39 by a line 50.

A line 51 connects the line 47 to the base of the PNP transistor 32C. A line 52 connects the base of the PNP transistor 32B to the line 48. A line 53 connects the base of the PNP transistor 32A to the line 49. The emitters of the PNP transistors 32A through 32C are connected to the output terminal 37 via a line 54. The emitters of the PNP transistors 32A through 32C are connected to the constant current circuit 33D by a line 57. A line 56 connects the constant current circuit 33D to the terminal 38. On the other hand, the collectors of the PNP transistors 32A through 32C are connected to the terminal 39 by a line 55.

Figure 4:
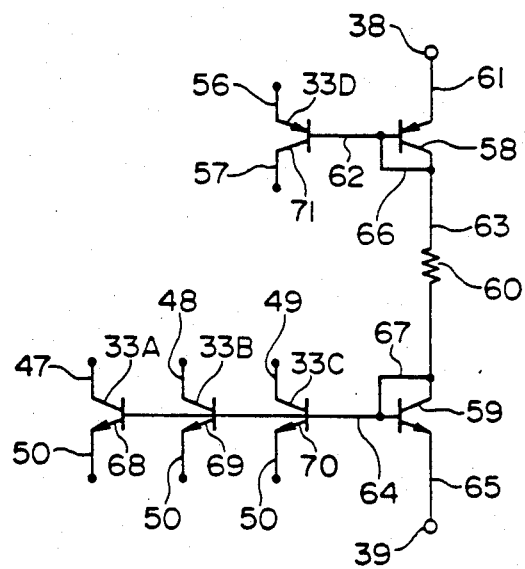
FIG. 4 is a circuit diagram of the constant current circuits applied to the circuit shown in FIG. 3.

FIG. 4 shows an example of the constant current circuit. This constant current circuit is generally referred to as a "current mirror circuit". The constant current circuits 33A–33C consist of NPN transistors 68–70, respectively. The constant current circuit 33D consists of a PNP transistor 71. A line 61 connects the terminal 38 to the emitter of the PNP transistor 58. A line 63 in which a resistor 60 is disposed connects the collector of the PNP transistor 58 to the collector of the NPN transistor 59. A line 65 which is connected to the terminal 39 is connected to the emitter of the NPN transistor 59. A line 62 connects the base of the PNP transistor 71 to the base of the PNP transistor 58. A line 66 connecting the base and collector of the PNP transistor 58 connects also the line 62 to the line 63. A line 64 connected to the base of the NPN transistor 59 is connected to the bases of the NPN transistors 68 through 70, respectively.

The lines 63 and 64 are connected to each other by a line 67 that connects the base and collector of the NPN transistor 59 to each other. A positive d.c. current is applied to the terminal 38 while a negative d.c. current is applied to the terminal 39. The constant current circuit shown in FIG. 4 is arranged so that the current flowing through the PNP transistors 58, the resistor 60 and the NPN transistor 59 flows also through the PNP transistors 33D and the NPN transistors 33A through 33C.

The operation of the middle value selection circuit 24 of this embodiment will be described. It will be assumed here that the signals A, B and C (analog signals) applied to the respective input terminals 36A, 36B and 36C have the voltages $E_1$, $E_2$ and $E_3$, respectively, and these voltages have the relation $E_1 > E_2 > E_3$. The signal A of the voltage $E_1$ is applied to the bases of the NPN transistors 31A and 31F by the line 43. The signal B of the voltage $E_2$ is applied to the bases of the NPN transistors 31B and 31C by the line 44. The signal C of the voltage $E_3$ flows through the line 45 and reaches the bases of the NPN transistors 31D and 31E. Since the relation $E_1 > E_2$ exists at the output end which is the junction between the emitters of the NPN transistors 31A, 31B of the high value selection circuit 34, a voltage which is lower by the voltage $V_{BE}$ of the NPN transistor 31A than the voltage $E_1$ (that is, $E_1 - V_{BE}$) is produced. This voltage signal flows through the lines 47 and 51 and is applied as the output of the high value selection circuit 34A to the base of the PNP transistor 32C of the low value selection circuit 35. The voltage $V_{BE}$ is the base-emitter voltage of the transistor. The relation $E_2 > E_3$ exists between the voltages $E_2$ and $E_3$ of the signals applied to the NPN transistors 31C and 31D of the high value selection circuit 34B. Accordingly, a voltage which is lower by the voltage $V_{BE}$ of the NPN transistor 31C than the voltage $E_2$ (that is, $E_2 - V_{BE}$) is generated at the junction of the emitters of these transistors. This voltage signal ($E_2-V_{BE}$) flows through the lines 48 and 52 and is applied as the output of the high value selection circuit 34B to the base of the PNP transistor 32B of the low value selection circuit 35. Furthermore, since the relation $E_1>E_3$ exists at the junction of the emitters of the NPN transistors 31E and 31F of the high value selection circuit 34C, a voltage lower by the voltage $V_{BE}$ of the NPN transistor 31F than the voltage $E_1$ (that is, $E_1-V_{BE}$) is generated and this voltage signal ($E_1-V_{BE}$) flows through the lines 49 and 53 and is applied to the base of the PNP transistor 32A of the low value selection circuit 35 as the output of the high value selection circuit 34C.

Since the relation $(E_1-V_{BE})>(E_2-V_{BE})$ exists when the PNP transistor 32A through 32C of the low value selection circuit 35 receive the respective voltage signals, a voltage higher by $V_{BE}$ of the PNP transistor 32B than the voltage $(E_2-V_{BE})$, [that is, $(E_2-V_{BE})+V_{BE}=E_2$], is generated at the junction of the emitters of these three transistors. This output signal is generated as the output signal of the middle value selection circuit 24 from the output terminal 37.

The voltage $V_{BE}$ is a kind of error. This error assumes a negative value in the high value selection circuits 34A-34C and a positive value in the low value selection circuit 34D. More definitely, the errors result from the difference of the characteristics of the NPN and PNP transistors. As the high and low value selection circuits having the inverse characteristics are combined as in this embodiment, the error occuring in the high value selection circuit is offset by the error occurring in the latter so that the error as the middle value selection circuit drops and hence, the accuracy of the middle value selection circuit can be improved as much. Especially because the constant current circuits 33A through 33D are respectively disposed for the high value selection circuits 34A-34C and the low value selection circuit 35, the absolute value of the voltage $V_{BE}$ of the high value selection circuit becomes equal to that of the low value selection circuit. Accordingly, the error of the output signal of the high value selection circuit virtually cancels out the error of the output signal of the low value selection circuit. At this time, the accuracy of the middle value selection circuit becomes maximum. The middle value selection circuit 24 generates a signal having the same value as the middle value of the three input signals.

When the d.c. power voltage applied between the terminals 38 and 39 changes, the current each of the constant current circuits of the high value selection circuits 34A-34C and low value selection circuit 35 also changes. However, the change value of the current of these constant current circuits is the same and the absolute value of the change value of the voltage $V_{BE}$ resulting from each transistor becomes equal. In this case, too, the change of the voltage $V_{BE}$ cancels out the output signals of the high and low value selection circuits, as described previously. Since NPN transistors are used for the high value selection circuits, the output current of the constant current circuits can be compensated for by the current amplifying operation of the NPN transistors even if the current capacity of the signals to be applied to the terminals 36A, 36B and 36C is small.

The reason why the error of the high value selection circuit can be cancelled by the error of the low value selection circuit will be explained in detail.

The base-emitter voltage $V_{BE}$ of the transistor is expressed by the following equation:

$$V_{BE} = \frac{kT}{q} \ln \frac{I_c}{I_s} \quad (1)$$

where
k is Boltzmann's constant ($1.38 \times 10^{-23}$ J/K), q is the charge quantity of electron ($1.6 \times 10^{-19}$ Coulomb), T is absolute temperature, $I_c$ is the collector current of the transistor and $I_s$ is the collector junction reverse saturation current per emitter area of the transistor.

Since $E_1>E_2>E_3$, the output voltage $E_{out}$ of the middle value selection circuit 24 is expressed by the following equation:

$$E_{out}=E_2-V_{BEH}+V_{BEL} \quad (2)$$

where
$V_{BEH}$ is the base-emitter voltage of the transistor of the high value selection circuit and $V_{BEL}$ is the base-emitter voltage of the low value selection circuit.

These base-emitter voltages $V_{BEH}$ and $V_{BEL}$ are expressed as follows with the proviso that the collector current $I_c$ of each transistor becomes equal to the output current $I_o$ of the constant current circuit:

$$V_{BEH} = \frac{kT}{q} \ln \frac{I_o}{I_s}, \quad (3)$$

$$V_{BEL} = \frac{kT}{q} \ln \frac{I_o}{I_s} \quad (4)$$

From the relation (3) and (4), $V_{BEH}=V_{BEL}$. When this relation is substituted in equation (2), $E_{out}=E_2$. Accordingly, the difference $\Delta E_{out}$ between the input and output voltages of the middle value selection circuit 24 is $0(=E_{out}-E_2)$.

Figure 5:
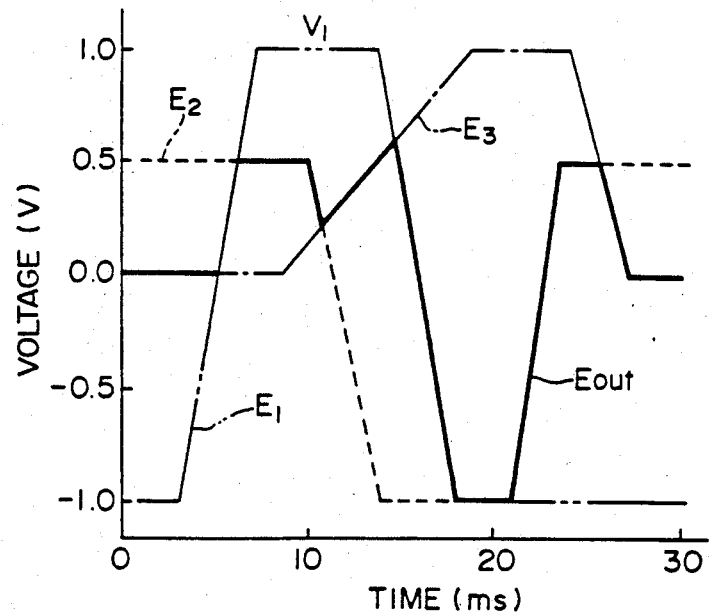
FIG. 5 is a diagram useful for explaining the operation of the middle value selection circuit shown in FIG. 3.

FIG. 5 shows the relation between the three input signals $E_1$ (two dot-and-chain line), $E_2$ (dash line), $E_3$ (dot-and-chain line) and the output signal $E_{out}$ (solid line). The middle value selection circuit 24 always generates a signal of the middle level.

Even when the relation of the magnitude of the signals applied to the input terminals 36A-36C changes, the middle value selection circuit 24 always selects the signal of the middle level from the three input signals and produces its output from the output terminal 39.

The middle value selection circuit in accordance with another embodiment of the present invention will be described with reference to FIGS. 6 and 7. In this embodiment, the low value selection circuits are disposed at the prior stage and the high value selection circuit, at the posterior stage, in constrast with the foregoing embodiment. The middle value selection circuit 80 in this embodiment consists of the low value selection circuits 81A through 81C and the high value selection circuit 82. Each low value selection circuit consists of a pair of PNP transistors and one constant current circuit and the high value selection circuit 82 consists of three NPN transistors and one constant current circuit.

The input terminal 36A is connected to the bases of the PNP transistors 83A and 83F by a line 86. A line 87 connected to the input terminal 36B is connected to the bases of the PNP transistors 83B and 83C. A line 88 connects the input terminal 36C to the bases of the PNP transistors 83D and 83E. The collectors of the PNP transistors 83A through 83D are connected to one another by a line 87 which is in turn connected to the terminal 39. A line 89 connects the emitters of the PNP transistors 83A and 83B to the constant current circuit 85A. A line 90 connects the emitters of the PNP transistors 83C and 83D to the constant current circuit 85B. A line 91 connected to the constant current circuit 85C is also connected to the emitters of the PNP transistors 83E and 83F. The constant current circuits 85A through 85C are connected to the terminal 38 by a line 92.

A line 93 connects the line 89 to the base of the NPN transistor 84A. A line 94 connects the line 90 to the base of the NPN transistor 84B. A line 95 connects the line 91 to the base of the NPN transistor 84C. The emitters of the NPN transistors 84A through 84C are connected to the output terminal 37 by a line 96. These emitters are also connected to the constant current circuit 85D by a line 98. A line 99 connects the constant current circuit 85D to the line 87. On the other hand, the collectors of the NPN transistors 84A through 84C are connected to the line 92 by the line 97.

Figure 7:
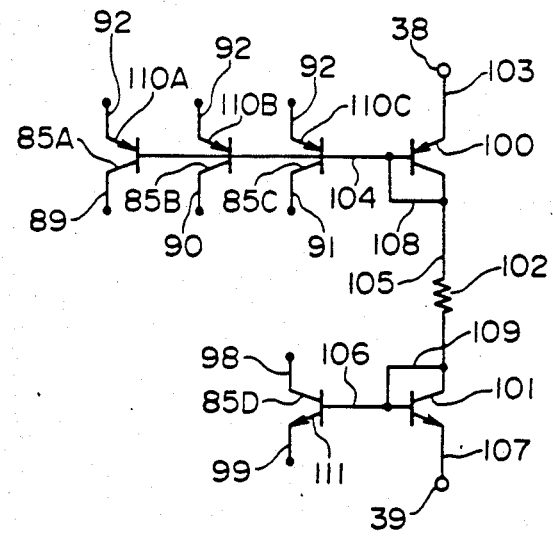
FIG. 7 is a circuit diagram of the constant current circuits applied to the circuit shown in FIG. 6.

The constant current circuit shown in FIG. 7 is also of the current mirror type in the same way as that of the embodiment shown in FIG. 4. The constant current circuits 85A through 85C consist of PNP transistors 110A through 110C, respectively. The constant current circuit 85D consists of an NPN transistor 111. The terminal 38 and the emitter of the PNP transistor 100 are connected to each other by a circuit 103. The base of the PNP transistor 100 is connected to the bases of the PNP transistors 110A through 110C by a circuit 104. A line 105 having a resistor 102 connects the collector of the PNP transistor 100 to the collector of the NPN transistor 101. The base of the NPN transistor 101 is connected to that of the NPN transistor 111 by a circuit 106. A circuit 107 connected to the terminal 39 is connected also to the emitter of the NPN transistor 101. A circuit 108 connecting the PNP transistor 100 is connected to circuits 104 and 105. A circuit 109 connecting the NPN transistor 101 is connected to circuits 105 and 106.

The operation of this middle value selection circuit 80 will be described. Signals A, B and C (analog signals) having the respective voltage values of $E_1$, $E_2$ and $E_3$ are applied to the input terminals 36A, 36B and 36C, respectively. It will be assumed that the voltages have the relation $E_1 > E_2 > E_3$. The signal A is applied to the transistors 83A and 83F, the signal B, to the PNP transistors 83B and 83C and the signal C, to the PNP transistors 83D and 83E. Since the voltages of the input signals have the relation described above, the low value selection circuit 81A produces a voltage $(E_2 + V_{BE})$, the low value selection circuit 81B produces a voltage $(E_3 + V_{BE})$ and the low value selection circuit 81C produces a voltage $(E_3 + V_{BE})$.

The output signals of these low value selection circuits are applied to the bases of the NPN transistors 84A through 84C of the high value selection circuit 82, respectively. Since the relation $(E_2 + V_{BE}) > (E_3 + V_{BE})$ exists, the high value selection circuit 82 produces a voltage which is lower by the voltage $V_{BE}$ of the NPN transistor 84A $[(E_2 + V_{BE}) - V_{BE}]$, that is, the voltage $E_2$, as the output. This voltage $E_2$ is generated at the output terminal 37.

This embodiment can provide the same effect as that of the embodiment shown in FIG. 3. Even when the current capacity of the signal to be applied to the terminals 36A, 36B and 36C is small, it can be supplemented by the operation of the PNP transistors for amplifying the output current of the constant current circuit.

Figure 6:
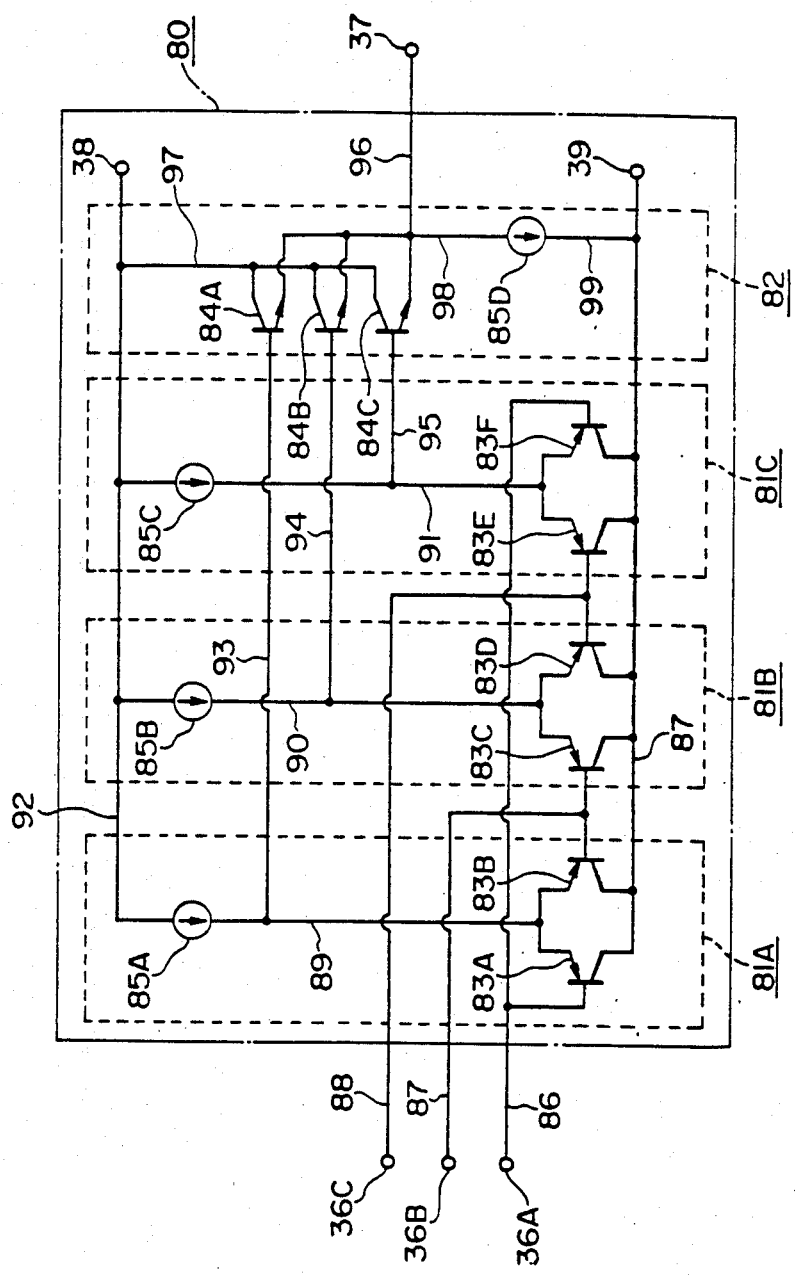
FIG. 6 is a circuit diagram of the middle value selection circuit in accordance with another embodiment of the present invention.

The embodiments shown in FIGS. 3 and 6 combine the high value section circuit(s) with the low value selection circuit(s) that cause the errors having the inverse polarities and improve the accuracy of the middle value selection circuit by utilizing the characteristics of the selection circuit itself. It is not necessary to dispose afresh any device so as to improve the accuracy and the middle value selection circuit thus becomes simple in construction.

The middle value selection circuit in accordance with still another embodiment of the present invention will be explained with reference to FIG. 8. In the middle value selection circuit of this embodiment, resistors 115A through 115D are disposed in place of the constant current circuits 33A through 33D of the middle value selection circuit 24 of FIG. 3. This middle value selection circuit 112 consists of the high value selection circuits 113A through 113C and the low value selection circuit 114. The high value selection circuit 113A includes a resistor 115A, which is connected to lines 47 and 50. A resistor 115B of the high value selection circuit 113B is connected to a line 48 and to a line 50. A resistor 115C of the high value selection circuit 113C is connected to lines 49 and 50. A resistor 115D of the low value selection circuit 114 is connected to lines 56 and 57.

This circuit operates in the same way as the circuit shown in FIG. 3 except that the current flowing through the high value section circuits and the low value selection circuit is determined by the power source and the resistors. For this reason, the circuit is directly affected by the influence of the power source voltage and the output voltage $E_{out}$ of the middle value selection circuit also changes with the change in the power source voltage.

Next, the between the input and output signals of the middle value selection circuit 112 will be described.

The voltage signal $E_H$ produced by the high value selection circuits is expressed by the following formula (5):

$$E_H = E_2 - V_{BEH} \tag{5}$$

$$V_{BEH} \simeq \frac{kT}{q} \ln \frac{\beta I_b}{I_s} \tag{6}$$

where
$\beta$ is a current amplification ratio at the emitter ground of the transistor, and $I_b$ is a current flowing through a circuit comprising the terminal 38, the resistor of the low value selection circuit, the PNP transistor of the low value selection circuit 114, the resistors of the high value selection circuit and the terminal 39.

The voltage signal $E_{out}$ produced by the low value selection circuit is expressed by the following formula (7):

$$E_{out} = E_H + V_{BEL} \tag{7}$$

$$V_{BEL} \simeq \frac{kT}{q} \ln \frac{\beta I_{bo}}{I_s} \tag{8}$$

where $I_{bo}$ is a current flowing through a circuit connecting the transistors and resistors of the high value selection circuit.

The output signal $E_{out}$ of the middle value selection circuit 112 is expressed by the following formula (9) on the basis of the formulas (5) through (8):

$$E_{out} = E_2 - \frac{kT}{q} \ln \frac{I_b}{I_{bo}} \qquad (9)$$

The current $I_b$ and $I_{bo}$ are expressed by the formulas (10) and (11):

$$I_b = \frac{E_2 + V_{BB} - V_{BEH}}{R} \qquad (10)$$

$$I_{bo} = \frac{V_{CC} + V_{BB} - V_{BEL}}{R + R} \qquad (11)$$

where $V_{BB}$ and $V_{CC}$ are voltages at the terminals 38 and 39, respectively, and R is the resistance of the resistors 115A through 115D.

From the formulas (10) and (11), the currents $I_b$ and $I_{bo}$ have different values. Accordingly, the second item of the right side of the formula (9) does not become zero so that the voltage $E_{out}$ does not become equal to the voltage $E_2$. Though the error becomes greater than that in the embodiment shown in FIG. 3, the error of one of the high and low value selection circuits is compensated for by the error of the other because the errors of these selection circuits have the opposite polarities. Accordingly, this embodiment can improve the accuracy over the prior art circuit.

The foregoing embodiments relate to the middle value selection circuits using the transistors but the middle value selection circuit can be constructed using diodes which are unidirectionally conductive devices. Such an embodiment will be described with reference to FIG. 9.

The middle value selection circuit 116 consists of the high value selection circuits 117A–117C and the low value selection circuit 118. The high value selection circuit 117A consists of a pair of diodes 119A, 119B and the constant current circuit 160A. The high value selection circuit 117B consists of a pair of diodes 119C, 119D and the constant current circuit 160B. The high value selection circuit 117C consists of a pair of diodes 119E, 119F and the constant current circuit 160C The high value selection circuit 118 consists of three diodes 119G–119I and the constant current circuit 33D. The diodes of the high value selection circuits are complementary to those of the low value selection circuit. This also holds true of the embodiment shown in FIG. 11.

The input terminal 36A is connected to the anodes of the diodes 119A and 119F by a line 120. The input terminal 36B is connected to the anodes of the diodes 119B and 119C by a line 121. A line 122 connects the input terminal 36C to the anodes of the diodes 119D and 119E. A line 123 connects the cathodes of the diodes 119A and 119B to the constant current circuit 160A. A line 124 connected to the cathodes of the diodes 119C and 119D is connected to the constant current circuit 160B. A line 125 connects the constant current circuit 160C to the cathodes of the diodes 119E and 119F. The constant current circuits 160A through 160C are connected to the terminal 39 by a line 126. The line 123 and the cathode of the diode 191I are connected to each other by a line 127. A line 128 connects the line 124 to the cathode of the diode 119H A line 129 connected to the line 125 is connected to the cathode of the diode 119G. A line 130 connected to the anodes of the diodes 119G through 119I is connected to the output terminal 37. The terminal 38 and the constant current circuit 33D are connected to each other by a line 131. A line 132 connected to the constant current circuit 33D is connected to the anodes of the diodes 119G through 119I.

Signals A, B and C (analog signals) having voltages $E_1$, $E_2$ and $E_3$ satisfying the relation $E_1 > E_2 > E_3$, respectively, are applied to the input terminals 36A, 36B and 36C, respectively. The signal A is applied to the anodes of the diodes 119A and 119F, the signal B, to the anodes of the diodes 119B and 119C and the signal C, to the anodes of the diodes 119D and 119E. The high value selection circuit 117A produced a voltage $[E_1 + (-V_F)]$, the high value selection circuit 117B produces a voltage $[E_2 + (-V_F)]$ and the high value selection circuit 117C produces a voltage $[E_3 + (-V_F)]$. Here, $(-V_F)$ represents the voltage drop of the diode in the forward direction. The output voltage of each high value selection circuit is applied to the cathodes of the diodes 119G through 119I of the low value selection circuit 118. The low value selection circuit 118 produces a voltage which is higher by the forward voltage $V_F$ of the diode, that is, a voltage $[(E_2 + V_F) + V_F] = E_2$, from the output terminal 37.

Figure 10:
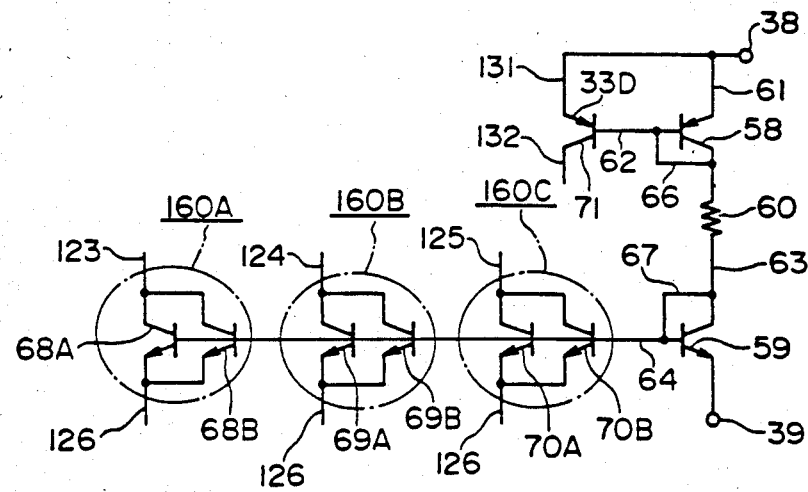
FIG. 10 is a circuit diagram of the constant current circuit applied to the embodiments shown in FIGS. 9, 13 and 15.

The constant current circuits 160A through 160C and 33D are current mirror type circuits shown in FIG. 10. The constant current circuits 160A through 160C disposed in the high value selection circuits 117A through 117C produce a current which is by twice higher than the current produced by the constant current circuit 33D of the low value selection circuit 118. These constant current circuits 160A through 160C and 33D will be explained with reference to FIG. 10. In the drawing, like reference numerals are used to identify like constituents as in FIG. 4.

The constant current circuits are different from the constant current circuit shown in FIG. 4 in that the constant current circuits 160A through 160C each consist of two transistors. In other words, the constant current circuit 160A consists of NPN transistors 68A and 68B, the constant current circuit 160B consists of NPN transistors 69A and 69B and the constant current circuit 160C consists of NPN transistors 70A and 70B. The bases of these six transistors are connected to the line 64. The collectors of the NPN transistors 68A and 68B are connected to the line 123 and their emitters, to the line 126. The collectors of the NPN transistors 69A and 69B are connected to the line 124 and their emitters, to the line 126. The collectors of the NPN transistors 70A and 70B are connected to the line 125 and their emitters, to the line 126.

If these constant current circuits are employed, the current value of the constant current circuits of the high value selection circuit becomes twice that of the constant current circuit of the low value selection circuit. In other words, the current produced from the constant current circuits 160A through 160C is $2I_o$ and the current produced from the constant current circuit 33D becomes $I_o$. Accordingly, the currents flowing through the diodes 119A through 119F can be made virtually equal to one another and the voltage drops of the diodes 119A through 119F in the forward direction can be made equal. The voltage $-V_F$, which is the error of the high value selection circuits 117A through 117C, can be compensated for by the error $V_F$ of the low value selection circuit 118.

In the middle value selection circuits using the diodes, the middle value can be obtained with a high level of accuracy in the same way as in the embodiment shown in FIG. 3 provided that the values of the three input signals are all different, such as when $E_1 > E_2 > E_3$, for example. However, if at least two of the three input signals are equal to each other such as when $E_1 = E_2 > E_3$, for example, the output signal of the middle value selection circuit 116 does not become equal to the middle value of these three input signals. In contrast, in the embodiment shown in FIG. 3, the middle value of the three input signals of the middle value selection circuit 24 becomes equal to its output signal even when $E_1 = E_2 > E_3$. Since this embodiment uses the diodes for the high and low value selection circuits, the number of the necessary components can be reduced and the construction of the middle value selection circuit can be remarkably simplified.

Figure 11:
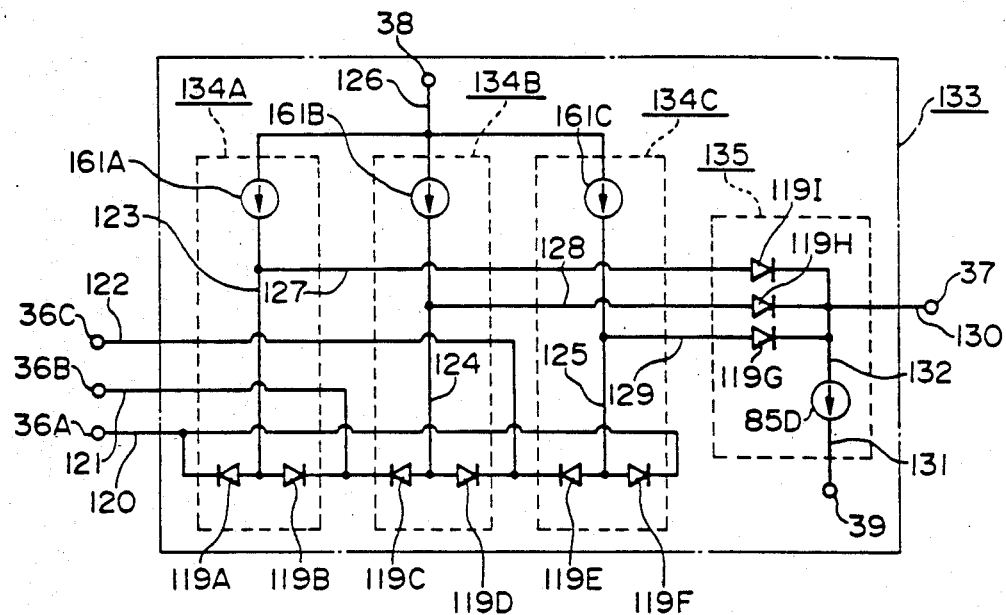

When the diodes are used, the low value selection circuit can be disposed at the prior stage with the high value selection circuits at the posterior stage, in the same way as in the embodiment shown in FIG. 6. Such an embodiment is illustrated in FIG. 11. The middle value selection circuit 133 of this embodiment consists of the low value selection circuits 134A through 134C and the high value selection circuit 135. The low value selection circuit 134A consists of the diodes 119A, 119B and the constant current circuit 161A. The low value selection circuit 134B consists of the diodes 119C, 119D and the constant current circuit 161B and the low value selection circuit 134C consists of the diodes 119E, 119F and the constant current circuit 161C.

Figure 12:
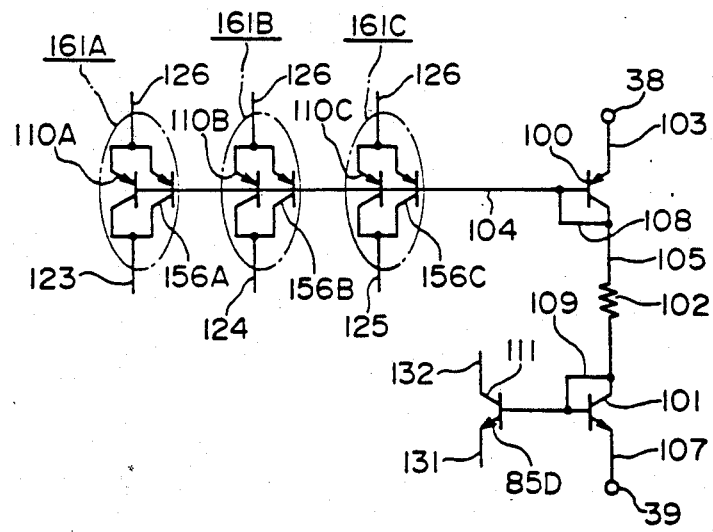
FIG. 12 is a circuit diagram of the constant current circuit applied to the embodiments shown in FIGS. 11, 14 and 16.

These constant current circuits are of the current mirror type as shown in FIG. 12. The current produced from the constant current circuits 161A through 161C of the low value selection circuits 134A through 134C is $2I_o$ while the current produced from the constant current circuit 85D of the high value selection circuit 135 is $I_o$. Hence, the current value of the former is twice that of the latter. The constant current circuits 161A through 161C consist of parallel circuits of PNP transistors 110A-156A, 110B-156B and 110C-156C, respectively. The bases of the PNP transistors 110A through 110C and 156A through 156C are connected to a circuit 104. The other constructions in FIG. 12 are the same as those of the constant current circuit shown in FIG. 7.

The lines 120, 121 and 122 in the middle value selection circuit 133 are connected to the cathodes of the diodes 119A through 119F, respectively. Lines 123, 124 and 125 connected to the constant current circuits 161A through 161C are connected to the anodes of the diodes 119A through 119F, respectively. A line 126 connects the terminal 38 to the constant current circuits 161A through 161C. Lines 127, 128 and 129 are connected to the anodes of the diodes 119I, 119H and 119G of the high value selection circuit 135, respectively. A line 130 is connected to the cathodes of the diodes 119G, 119H and 119I. Lines 131 and 132 connected to the constant current circuit 85D are connected to the terminal 39 and to the cathodes of the diodes 119G through 119I, respectively.

Signals A, B and C are applied to the input terminals 36A, 36B and 36C, respectively. These signals A, B and C (analog signals) have the voltages $E_1$, $E_2$ and $E_3$ that satisfy the relation $E_1 > E_2 > E_3$ in the same way as in the embodiment shown in FIG. 9. The low value selection circuit 134A produces a voltage $(E_2 + V_F)$. The low value selection circuit 135B produces a voltage $(E_3 + V_F)$ and the low value selection circuit 134C does a voltage $(E_3 + V_F)$. In other words, each low value selection circuit produces the voltage which is higher by the forward voltage of each diode than the voltage of the input signal. The output voltage of each low value selection circuit is applied to the anode of each diode of the high value selection circuit 135. The high value selection circuit 135 produces a voltage $E_2$ which is lower by the voltage drop $(-V_F)$ in the forward direction of the diode 119I than the voltage $(E_2 + V_F)$. This embodiment provides the same effect as that of the embodiment shown in FIG. 9.

Figure 13:
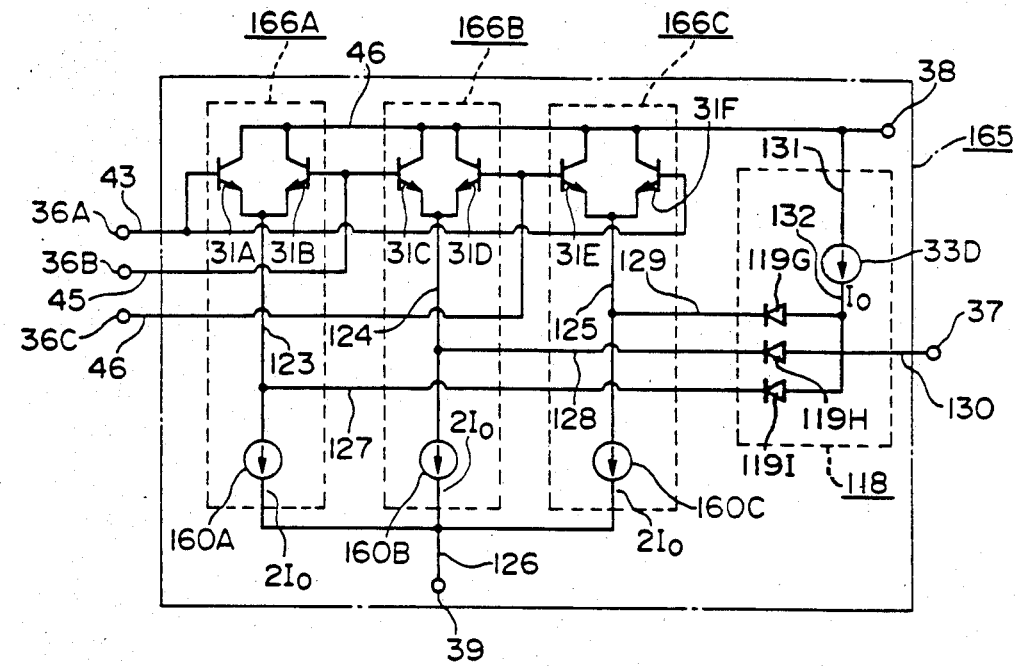

The middle value selection circuit 165 in accordance with still another embodiment of the present invention is shown in FIG. 13. The middle value selection circuit 165 consists of the high value selection circuits 166A through 166C and the low value selection circuit 118. The middle value selection circuit 165 is formed by replacing the diodes of each high value selection circuit of the middle value selection circuit 116 shown in FIG. 9 by an NPN transistor. The high value selection circuit 166A consists of a air of NPN transistors 31A, 31B and one constant current circuit 160A. The high value selection circuit 166B consists of a pair of NPN transistors 31C, 31D and one concurrent circuit 160B. The high value selection circuit 166C consists of a pair of NPN transistors 31E, 31F and one constant current circuit 160C. The NPN transistors of the high value selection circuit of this embodiment are complementary to the diodes of the low value selection circuit. Each constant current circuit has the same construction as that shown in FIG. 10.

Figure 9:
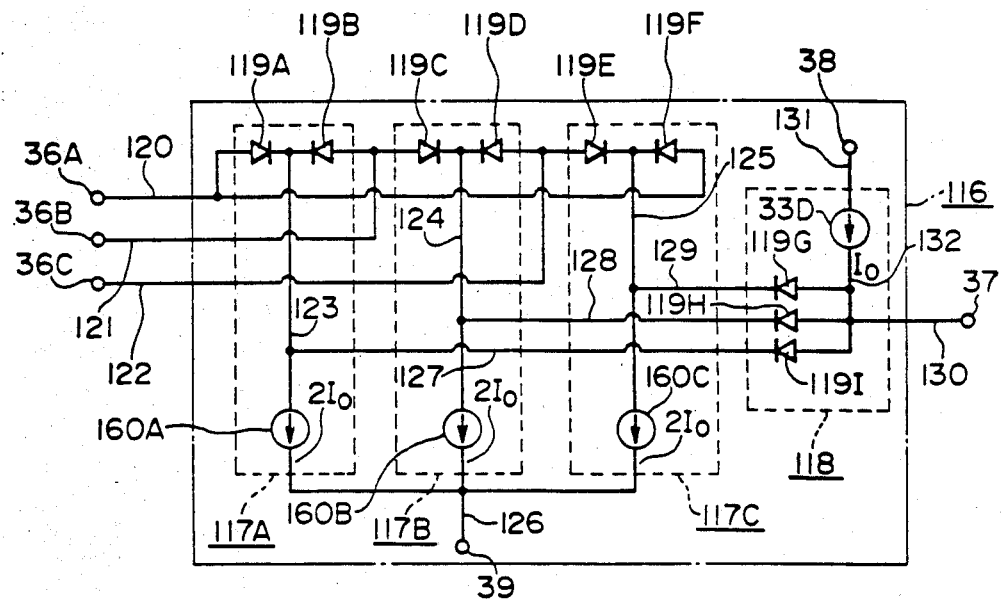

This embodiment provides the same effect as that of the embodiment shown in FIG. 9 except that its construction becomes a bit more complicated because the NPN transistors are used. Since this embodiment uses the diodes for the low value selection circuit, the construction can be more simplified when compared with the construction of the embodiment shown in FIG. 3. Since the NPN transistors are used for the high value selection circuits, the output current of the constant current circuits can be supplemented by the current amplification operation of the NPN transistors even if the current capacity of the input signals applied to the terminals 36A, 36B and 36C is small.

Figure 14:
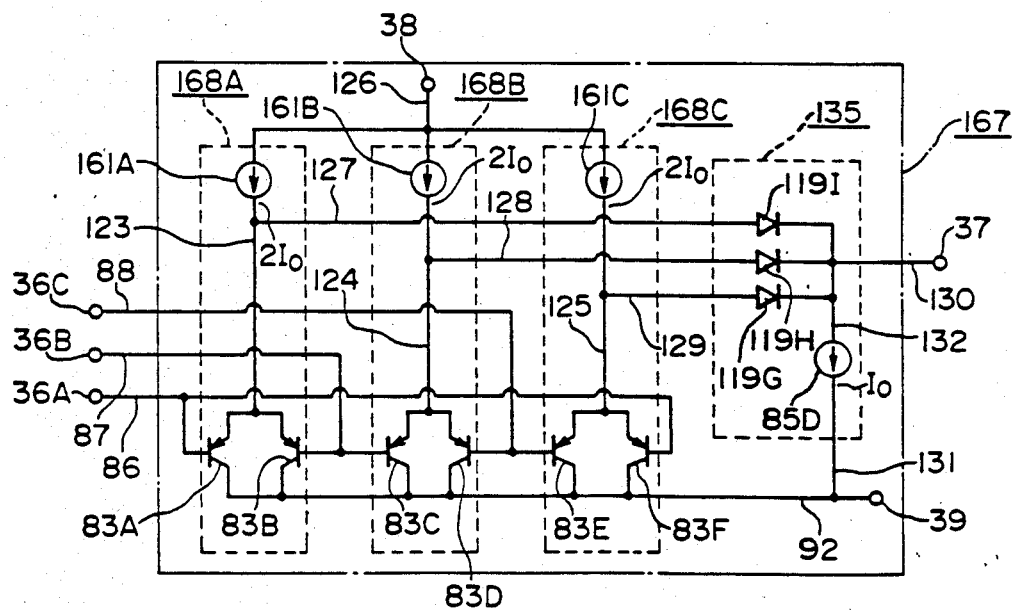

FIG. 14 shows the middle value selection circuit 167 in accordance with still another embodiment of the present invention. In this embodiment, the diodes of the low value selection circuits of the middle value selection circuit 133 shown in FIG. 11 are replaced by the PNP transistors. The low value selection circuir 168A consists of a pair of PNP transistors 83A, 83B and one constant current circuit 161A. The low value selection circuit 168B consists of a pair of PNP transistors 83C, 83D and one constant current circuit 161B. The low value selection circuit 168C consists of a pair of PNP transistors 83E, 83F and one constant current circuit 161C. Each constant current circuit has the same as one shown in FIG. 12. The PNP transistors of the low value selection circuits of this embodiment are complementary to the diodes of the high value selection circuit. This embodiment can provide the same effect as that of the middle value selection circuit 165 shown in FIG. 13. In this embodiment, too, the output current of the constant current circuit can be supplemented by the current amplification operation of the PNP transistors even if the current capacity of the input signals applied to the terminals 36A, 36B and 36C is small, in the same way as the middle value selection circuit 165.

Figure 15:
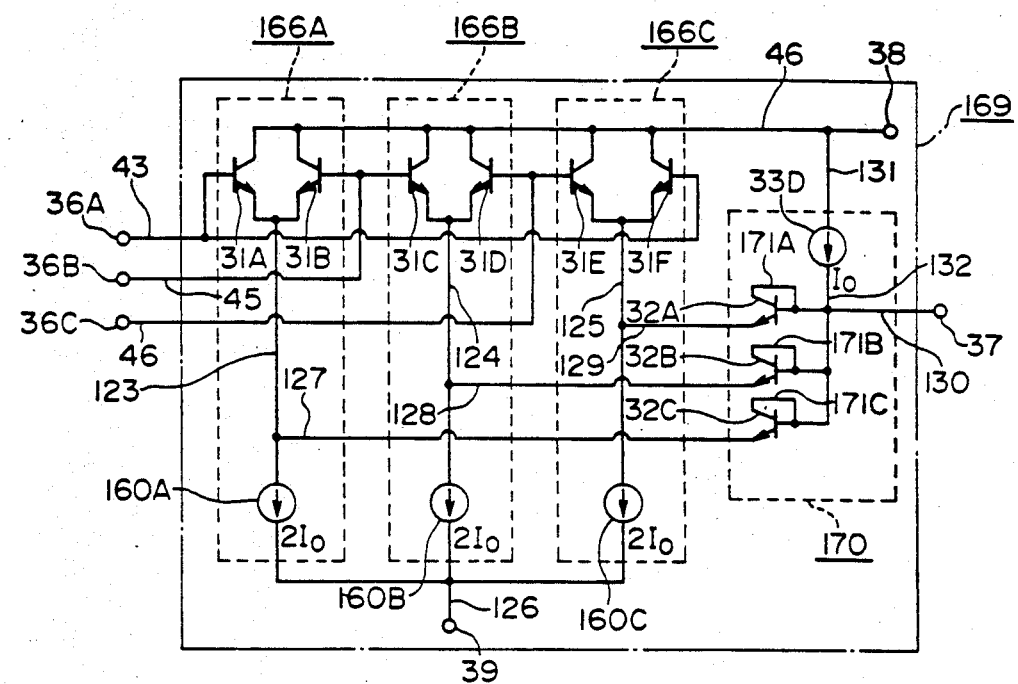

If the high and low value selection circuits of the middle value selection circuit 24 shown in FIG. 3 are composed of NPN and PNP transistors produced with the same characteristics, the voltage $V_{BE}$ of the NPN transistors becomes completely equal to the voltage $V_{BE}$ of the PNP transistors, as described previously. Accordingly, the error of the high value selection circuit and the error of the low value selection circuit can be completely cancelled by each other. If the middle value selection circuit 24 is composed of an integrated circuit (hereinafter referred to as "IC"), however, the absolute values of the voltages $V_{BE}$ of the NPN and PNP transistors are likely to become different. In order to make equal the absolute values of the voltages $V_{BE}$ of the NPN and PNP transistors formed on the same substrate to each other, the production steps of the IC of the middle value selection circuit 24 becomes remarkably complicated. When the NPN and PNP transistors are formed on the same substrate, therefore, the construction of these transistors is simplified in order to simplify the production steps. If the transistors are of the simplified type, however, the absolute values of the voltages $V_{BE}$ of the transistors become different. In such a case, the middle value selection circuit can not be mass-produced. The inventors of the present invention have examined the structures of the IC of the middle value selection circuits in which the errors of the high and low value selection circuits can be mutually compensated for and moreover, the production steps can be simplified. As a result, the middle value selection circuit shown in FIGS. 15 and 16 can be obtained The middle value selection circuit 169 of the embodiment of the invention shown in FIG. 15 is formed by replacing the diodes of the low value selection circuit of the middle value selection circuit 165 shown in FIG. 13 by NPN transistors and by connecting the collectors to bases of these NPN transistors so as to furnish them with the diode function. Each NPN transistor whose collector is connected to the base is a unidirectionally conductive device.

The middle value selection circuit 169 consists of the high value selection circuits 166A through 166C and the low value selection circuit 170. The low value selection circuit 170 consists of three NPN transistors 32A-32C and the constant current circuit 33D. The constant current circuit of the middle value selection circuit 169 is shown in FIG. 10. The emitter of the NPN transistor 32A is connected to a line 129 and the emitter of the transistor 32B is connected to a line 128. The emitter of the NPN transistor 32C is connected to a line 127. A circuit 130 is connected to the bases of the NPN transistors 32A-32C. The collectors of these NPN transistors are connected to a line 130 via lines 171A, 171B and 171C, respectively. The other construction of this embodiment is the same as that of the embodiment shown in FIG. 13. The NPN transistors of the high value selection circuits 166A-166C are complementary to the NPN transistors of the low value selection circuit 170 whose bases are connected to the emitters and which thus function as the diodes.

This embodiment uses the NPN transistors which are of the same kind in both high and low value selection circuits 166A-166C and 170 Accordingly, the IC of the middle value selection circuit 169 can be obtained by simple fabrication steps. Moreover, the characteristics of the semiconductor devices of the high value selection circuit in the resulting middle value selection circuit 169 can be made equal to those of the semiconductor devices of the low value selection circuit. In other words, the absolute value of the voltage $V_{BE}$ of the NPN transistors of the high value selection circuit becomes equal to that of the NPN transistors (or voltage $V_F$ in terms of diodes) of the low value selection circuit 170. Since the middle value selection circuit of this embodiment can simplify the production steps and can cancel mutually the errors of the high and low value selection circuits, it is particularly suitable for mass-production.

The constant current circuit in this embodiment is of the current mirror type as shown in FIG. 10. Accordingly, the current value of the constant current circuits of the high value selection circuits 166A-166C becomes $2I_o$ and twice the current value $I_o$ of the low value selection circuit 170.

Figure 16:
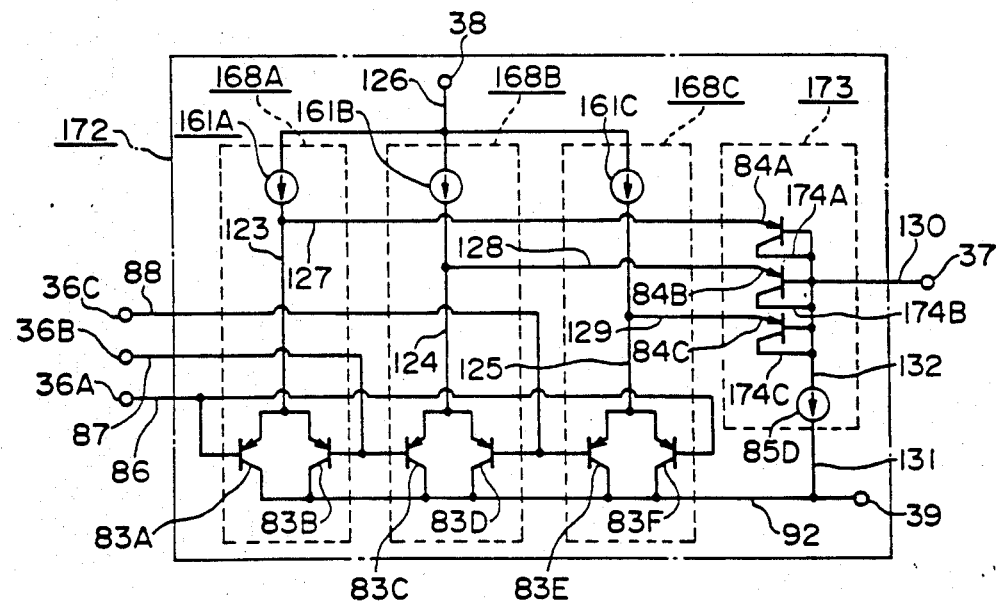

The middle value selection circuit in accordance with still another embodiment of the present invention shown in FIG. 16 uses the PNP transistors of the low value selection circuit at the prior stage of the middle value selection circuit 167 shown in FIG. 14 as the semiconductor devices of the high value selection circuit at the posterior stage. This embodiment can solve the problem encountered during production of the IC of the middle value selection circuit, in the same way as the embodiment shown in FIG. 15.

The middle value selection circuit 172 consists of the low value selection circuits 168A-168C and the high value selection circuit 173. The current mirror type constant current circuit shown in FIG. 12 is used as the constant current circuit for each of the high and low value selection circuits. The high value selection circuit 173 consists of the PNP transistors 84A-84C and the constant current circuit 85D. The bases of the PNP transistors 84A-84C are all connected to a line 130. This line is connected to the collectors of the PNP transistors 84A-84C by lines 174A-174C, respectively. The emitter of the PNP transistor 84A is connected to a line 127 and the emitter of the PNP transistor 84B, to a line 128. The emitter of the PNP transistor 84C is connected to a line 129.

The PNP transistors 84A-84C of the high value selection circuit 173 function as the diodes. The PNP transistors of the low value selection circuits 168A-168C are complementary to the PNP transistors functioning as the diodes, of the high value selection circuit 173. The PNP transistors of this embodiment whose collectors are connected to the bases are unidirectionally conductive devices. This embodiment can provide the same effect as the embodiment shown in FIG. 15.

Figure 8:
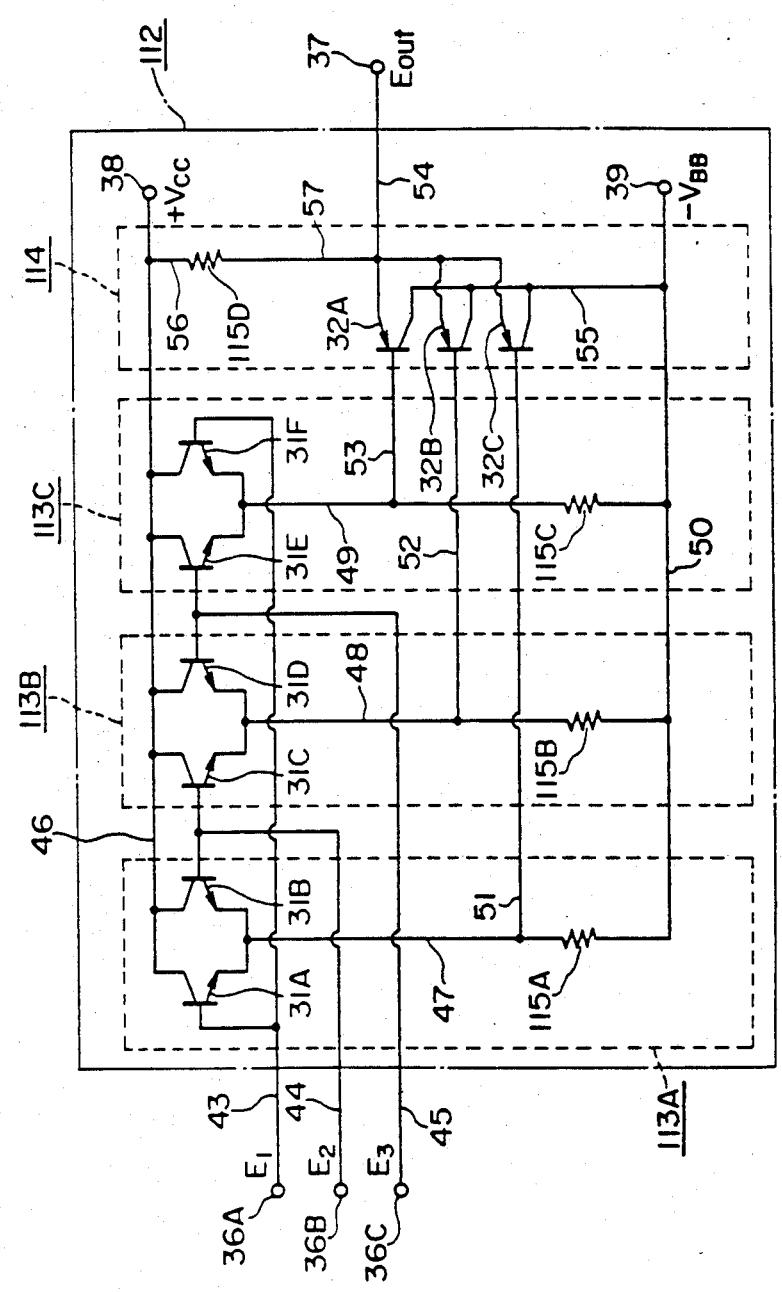
FIG. 8, 9, 11, 13, 14, 15, 16 and 17 are circuit diagrams of the middle value selection circuits in accordance with other embodiments of the present invention.

The constant current circuit shown in each of FIGS. 9, 11 and 13 through 16 may be formed by using the resistors as in the embodiment shown in FIG. 8. In such a case, the value of the resistors of the three selection circuits disposed at the prior stage is made ½ of the resistance of the resistors of one selection circuit disposed at the posterior stage so that the current value produced from the resistors of the selection circuits of the prior stage becomes twice the current value produced from the resistors of the selection circuit of the posterior stage.

Figure 17:
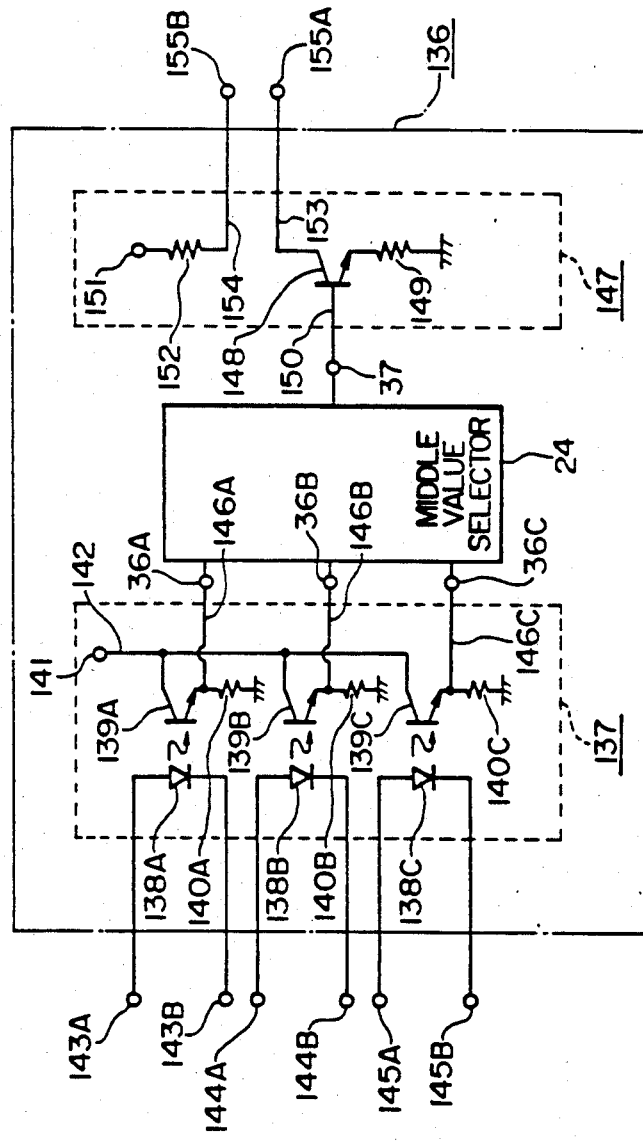

The foregoing embodiments illustrate the middle value selection circuits when the input signals of the voltage type. FIG. 17 shows the middle value selection circuit when the input signals are of the current type. The middle value selection circuit 136 consists of the voltage type middle value selection circuit shown in FIG. 3, a current voltage conversion circuit 137 and a voltage-current conversion circuit 147. In other words, the middle value selection circuit 136 converts the current signal to the voltage signal, applies it to the voltage type middle value selection circuit and then converts the voltage signal, which is the output signal of the voltage type middle value selection circuit, to the current signal as its output.

The current-voltage conversion circuit 137 consists of three light isolators each of which consists in turn of a light emission diode as a light emitting element and a photo transistor as a light receiving element, and three resistors. The first light isolator consists of the light emission diode 138A and the photo transistor 139A, the second consists of the light emission diode 138B and the photo diode 139B and the third consists of the light emission diode 138C and the photo transistor 139C. The photo transistors 139A–139C are of the NPN transistor type. The anode of the light emission diode 138A is connected to a terminal 143A, the cathode of the light emission diode 38A is connected to a terminal 143B and a terminal 144A is connected to the anode of the light emission diode 138B. A terminal 144B is connected to the cathode of the light emission diode 138B. A terminal 145A is connected to the anode of the light emission diode 138C and a terminal 145B is connected to the cathode of the light emission diode 138C. The terminals 143A, 144A and 145A are connected to the sensors 21, 22 and 23 shown in FIG. 2 (each of said sensors being grounded). The terminals 143B, 144B and 145B are grounded. The emitters of the photo transistors 139A, 139B and 139C are grounded via resistors 140A, 140B and 140C, respectively. The input terminals 36A, 36B and 36C of the middle value selection circuit 24 are connected to the emitters of the photo transistors 139A, 139B and 139C via lines 146A, 146B and 146C, respectively. A power terminal 141 for d.c. biasing is connected to the collectors of the photo transistors 139A through 139C by a line 142.

The voltage-current conversion circuit 147 consists of an NPN transistor 148 and two resistors 149 and 152. The base of the NPN transistor 148 is connected to the output terminal 37 of the middle value selection circuit 24 by a line 150. The emitter of the NPN transistor 148 is grounded via a resistor 149. A line 153 connects a terminal 155A to the collector of the NPN transistor 148. A power terminal 151 for d.c. biasing is connected to a terminal 155B by a line 154 having the resistor 152. Terminals 155A and 155B are connected to a load inside the controller.

It will be assumed that a current signal $I_1$ flowing through the terminals 143A and 143B, a current signal $I_2$ flowing through the terminals 144A and 144B and a current signal $I_3$ flowing through the terminals 145A and 145B are applied to the first, second and third light converters, and that the current signals (analog signals) have the relation $I_1 > I_2 > I_3$. The photo transistors 139A–139C of these light converters produce current signals $KI_1$, $KI_2$ and $KI_3$, respectively. Since the resistance values of the resistors 140A through 140C are equal to one another, the current-voltage circuit 137 produces voltage signals $E_1$, $E_2$ and $E_3$ that are proportional to the input currents at the input terminals 36A, 36B and 36C, respectively.

Upon receiving these voltage signals $E_1$, $E_2$ and $E_3$, the middle value selection circuit 24 produces the voltage signal $E_2$ of the middle level as described previously.

The voltage-current conversion circuit 147 converts the input voltage signal $E_2$ to the current signal $I_2$ by the operation of the NPN transistor 148 and the resistors 149 and 152. This current signal $I_2$ is produced at the terminal 155A.

This embodiment provides the same effects as the embodiment shown in FIG. 3 and makes it easy to select the middle value of the current signals. Since the light converters are used at the input stage, electric insulation can be established easily. Accordingly, even when a high current is detected by a detector, not only the middle value selection circuit but also the controller disposed at the posterior stage with respect to the former can be protected.

Any one of the aforementioned middle value selection circuits 80, 112, 116 and 133 can be used in place of the middle value selection circuit 24 of the middle value selection circuit 136.

When the current signal as the input signal is negative, the middle value selection circuit 136 may be arranged in such a fashion that the photo transistors forming the light converters of the middle value selection circuit 136 are changed to the PNP type, the polarity of the power source at the power terminals 141 and 151 is changed and the NPN transistor 148 is changed to the PNP transistor.

In accordance with the present invention that has been described in the foregoing, the errors occurring in both high and low value selection circuits can be mutually compensated for and the middle value selection circuit having high accuracy and yet being simple in construction can be obtained.

What is claimed is:

1. In a multiplex control apparatus having a plurality of control means which receive independent input signals from an object to be controlled thereby and produce respective control output signals separately, and first middle value selection means which receives the control output signals from the control means to output a final control signal to the object to be controlled by selecting the control output signal with the middle value among the signals from the control means, the improvement comprises plural sensor means for independently sensing an identical phenomenon of the object to be controlled to create detecting output signals respectively and a plurality of second middle value selection means corresponding in number to that of said control means, each of which is connected to receive the detecting output signals of said sensor means and selects the signal having the middle value among the received signals to provide an input signal to a corresponding one of said control means.

2. A multiplex control apparatus according to claim 1, in which each of said second middle value selector means includes three first selection means for receiving mutually different combinations of two analog signals among three input analog signals and selecting and producing either one of the greater or smaller signal of said two analog signals and second selection means for receiving as an input signal the output signals of said first selection means to produce a signal representative of a minimum value of the input signals when said firt selection means selects said greater signals and a signal representative of a maximum value of the input signals when said first selection means selects said smaller signals, the improvement wherein said first and second selection means are composed of semiconductor devices and there is further provided constant current means for supplying a constant current for said first and second selection means so that an error component resulting from the semiconductor devices of said first selection means and included in the signal from said first selection means is complementary to an error component caused by the semiconductor device of said second selection means and said error components have stable values in spite of variations in the values of said input signal.

3. A multiplex control apparatus as defined in claim 2 wherein said firt selection means are either one of a high value selection circuit and a low value selection circuit and said second selection means are the other.

4. A multiplex control apparatus as defined in claim 3 wherein said first selection means each consist of a pair of first semiconductor devices and a first constant current circuit connected to each of said first semiconductor devices, said second selection means includes three second seimconductor devices and a second constant current circuit connected to each of said second semiconductor devices, and said first and second semiconductor devices are complementary to each other.

5. A multiplex control apparatus as defined in claim 4 wherein said first and second semiconductor devices are complementary transistors.

6. A multiplex control apparatus according to claim 1, in which each of said second middle value selection means includes three first selection means for receiving mutually different combinations of two analog signals among three input analog signals and selecting and producing either one of the greater or smaller signal of said two analog signals and second selection means for receiving as an input signal the output signals of said first selection means to produce a signal representative of a minimum value of the input signals when said first selection means selects said greater signals and a signal representative of a maximum value of the input signals when said first selection means selects said smaller signals, wherein said first and second selection means are composed of semiconductor device and there is further provided constant current means for supplying a constant current for said first and second selection means so that an errror component resulting from the semiconductor devices of said first selection means and included in the signal from said first selection means is complementary to an error component caused by the semiconductor device of said second selection means and said error components have stable values in spite of variations in the values of said input signal, and wherein each of said first selection means consists of a pair of semiconductor devices in the form of transistors of a first conductivity type and a first constant current circuit connected in common to said pair of semiconductor devices, and said second selection means consists of three semiconductors devices in the form of unidirectionally conductive elements of a second conductivity type and a second constant current circuit connected to each of said semiconductor devices of said second conductivity type, said first and second conductivity types being complementary to each other, said first constant current circuit producing a current whose magnitude is twice the magnitude of the output current of said second constant current circuit.

7. A multiplex control apparatus as defined in claim 6, wherein said semiconductor device of said first conductivity type is a transistor, said second semiconductor device of said second conductivity type is a unidirectionally conductive element and said first constant current circuit produces a current whose magainitude is twice the magnitude of the output current of said second constant current circuit.

8. A multiplex control apparatus as defined in claim 6 wherein said unidirectionally conductive elements is a transistor, two electrodes of which are connected to each other so that the transistor operates as a unidirectionally conductive element and the remaining electrode is suppled with the output of said first selection means.

9. A multiplex control apparatus as defined in claim 6 wherein said unidirectionally conductive elements are diodes.

10. A multiplex control appratus according to claim 1, in which each of said second middle value selection means includes three first selection means for receiving mutually different combinations of two analog signals among three input analog signals and selecting and producing either one of the greater or smaller signal of said two analog signals and second selection means for receiving as an input signal the output signals of said first selection means to produce a signal representative of a minimum value of the input signals when said first selection means selects said greater signals and a signal representative of a maximum value of the input signals when said first selection means selects said smaller signals, wherein said first and second selection means are composed of semiconductor devices and there is further provided constant current means for supplying a constant current for said first and second selection means so that an error component resulting from the semiconductor devices of said first selection means and included in the signal from said first selection means is complementary to an error component caused by the semiconductor device of said second selection means and said error components have stable values in spite of variations in the values of said input signal, and wherein each first selection means includes a pair of semiconductor devices and a first constant current circuit and said second selection means includes three semiconductor devices and a second constant current circuit, each of said semiconductor devices in said second selection means being unidirectionally conductive elements and said first constant current circuit producing a current whose magnitude is twice the magnitude of the output current of said second constant current circuit.

11. A multiplex control apparatus as defined in claim 10 wherein said unidirectionally conductive elements are transistors, each having two electrodes connected to each other so that the transistor operates as a unidirectionally conductive element and a remaining electrode supplied with the output of said first selection means.

12. A multiplex control apparatus as defined in claim 10 wherein said semiconductor devices in each of said first selection means are unidirectionally conductive elements.

13. A multiplex control apparatus as defined in claim 12 wherein said semiconductor devices in each of said first selection means are diodes.

14. A multiplex control apparatus as defined in claim 12 wherein the unidirectional elements of said first and second selection means are diodes, each of said first selection means being composed of a pair of the diodes connected in the electrically opposite direction to each other and said first constant current circuit, and said second selection means being composed of three diodes connected to the corresponding one of said pairs of diodes and said second constant current circuit.

15. A multiplex control apparatus as defined in claim 10 wherein said unidirectionally conductive elements are diodes.

16. A multiplex control apparatus according to claim 1, in which each of said second middle value selecting means includes three first selection means for receiving mutually different combinations of two analog signals among three input analog signals and selecting and producing either one of the greater or smaller signal of said two analog signals and second selection means for receiving the output signals of said first selection means, respectively, and in which said second selection means produce a signal representative of a minimal value of the input signals when said first selection means select said greater signals and a signal representative of a maximal value of the input signals when said first selection means select said smaller signal, wherein said first and second selection means are composed of complementary semiconductor devices.

17. A multiplex control apparatus according to claim 1, in which each of said second middle value selection means includes three first selection means for receiving mutually different combinations of two analog signals among three input analog signals and selecting and producing either one of the greater or smaller signal of said two analog signals and second selection means for receiving as an input signal the output signals of said first selection means to produce a signal representative of a minimum value of the input signals when said first selection means selects said greater signals and a signal representative of a maximum value of the input signals when said first selection means selects said smaller signals, wherein said first and second selection means are composed of semiconductor devices and there is further provided constant current means for supplying a constant current for said first and second selection means so that an error component resulting from the semiconductor devices of said first selection means and included in the signal from said first selection means is complementary to an error component caused by the semiconductor device of said second selection means and said error components have stable values in spite of variations in the values of said input signal, first conversion means for converting said analog signals as a current signal into voltage analog signals and for supplying said voltage analog signal to said first selection means, and second conversion means for converting the output signal, as a voltage signal, of said second selection means into a current signal.

18. A multiplex control apapratus as defined in claim 17 wherein said first conversion means is a light converter which has a photodiode converting a current input signal into a light signal and a photo transistor changing the light signal to a voltage signal.

19. A multiplex control apparatus according to claim 1, in which each of said second middle value selection means includes three first selection means each comprising a pair of semiconductor means for receiving two analog signals of a mutually different combination among three input analog signals and selecting and producing either one of the greater or smaller signal of said two analog signals, and second selection means composed of three semiconductor devices each connected to the corresponding tone of said first selection means for receiving as an input signal the output signal of said first selection means to produce a signal representative of minumum value of the input signals when said first selection means selects said greater signals and a signal representative of a maximum value of the input signals when said first selection means selects said smaller signals, wherein said first and second selection means are composed of semiconductor devices and there is further provided constant current means for supplying the constant current for said first and second selection means so that an error component resulting from the semiconductor devices of said first selection means and included in the signal from said first selection means is complementary to an error component caused by the semiconductor device of said second selection means with respect to the connecting point of said first and second selection means and said error components have stable values in spite of variations in the values of said input signals.

* * * * *